United States Patent
Sasaki

(10) Patent No.: US 8,085,513 B2
(45) Date of Patent: Dec. 27, 2011

(54) MAGNETIC SENSOR

(75) Inventor: Tomoyuki Sasaki, Tokyo (JP)

(73) Assignee: TDK Corporation, Tokyo (JP)

( * ) Notice: Subject to any disclaimer, the term of this patent is extended or adjusted under 35 U.S.C. 154(b) by 266 days.

(21) Appl. No.: 12/608,583

(22) Filed: Oct. 29, 2009

(65) Prior Publication Data

US 2010/0119875 A1    May 13, 2010

(30) Foreign Application Priority Data

Nov. 10, 2008   (JP) ................................ 2008-287996

(51) Int. Cl.
G11B 5/39 (2006.01)

(52) U.S. Cl. .................................. 360/324.2

(58) Field of Classification Search ............ 360/119.02, 360/119.04, 314, 319, 322, 324, 324.1, 324.11, 360/324.12, 324.2
See application file for complete search history.

(56) References Cited

U.S. PATENT DOCUMENTS

| | | | |
|---|---|---|---|
| 7,209,328 B2 * | 4/2007 | Ito et al. ...................... | 360/324.2 |
| 7,253,995 B2 * | 8/2007 | Takahashi et al. ........... | 360/324.2 |
| 7,280,322 B2 * | 10/2007 | Takahashi et al. ........... | 360/324.1 |
| 7,298,597 B2 * | 11/2007 | Carey et al. ................. | 360/324.2 |
| 7,492,631 B1 | 2/2009 | Assefa et al. | |
| 7,522,392 B2 * | 4/2009 | Carey et al. ................. | 360/324.2 |
| 7,678,475 B2 | 3/2010 | Slavin et al. | |
| 7,755,928 B2 * | 7/2010 | Anezaki et al. .............. | 365/154 |
| 7,755,929 B2 | 7/2010 | Inomata et al. | |
| 2005/0111138 A1 * | 5/2005 | Yamakawa et al. ........... | 360/126 |
| 2006/0262458 A1 | 11/2006 | Carey et al. | |
| 2007/0253116 A1 * | 11/2007 | Takahashi ................... | 360/313 |

FOREIGN PATENT DOCUMENTS

JP   A-2007-299467    11/2007
JP   B2-4029772       1/2008

OTHER PUBLICATIONS

U.S. Appl. No. 12/471,909, filed May 26, 2009, in the name of Tomoyuki Sasaki.
U.S. Appl. No. 12/471,995, filed May 26, 2009, in the name of Tomoyuki Sasaki.
U.S. Appl. No. 12/471,804, filed May 26, 2009, in the name of Tomoyuki Sasaki.
Sep. 29, 2011 Office Action issued in U.S. Appl. No. 12/471,804.
Sep. 30, 2011 Office Action issued in U.S. Appl. No. 12/471,995.

* cited by examiner

Primary Examiner — Angel A. Castro
(74) Attorney, Agent, or Firm — Oliff & Berridge, PLC

(57) ABSTRACT

An object is to provide a magnetic sensor permitting an increase in potential output. The magnetic sensor has a channel layer, a magnetization free layer provided on a first portion of the channel layer and configured to detect an external magnetic field, and a magnetization fixed layer provided on a second portion different from the first portion of the channel layer, and a cross-sectional area of the magnetization fixed layer in a surface opposed to the channel layer is larger than a cross-sectional area of the magnetization free layer in a surface opposed to the channel layer.

14 Claims, 4 Drawing Sheets

MAGNETIC SENSOR

BACKGROUND OF THE INVENTION

1. Field of the Invention

The present invention relates to a magnetic sensor.

2. Related Background Art

A magnetoresistive element is known as a magnetic sensor used in a thin-film magnetic recording/reproducing head or the like. In the magnetoresistive element, generally, an electric current is made to flow between a magnetization fixed layer and a magnetization free layer, thereby obtaining a high output. However, the magnetoresistive element produces a signal unnecessary for the magnetic sensor, which is caused, for example, by domain wall displacement due to spin torque given by the electric current.

Another known magnetic sensor is a Spin Accumulation (SA) magnetic sensor in which the magnetization free layer and the magnetization fixed layer are formed on an identical horizontal surface (channel layer for spin accumulation) (e.g., cf. Patent Document 1 and Patent Document 2). For example, when the spin accumulation magnetic sensor is used in the thin-film magnetic recording/reproducing head, there is no need for flowing an electric current to the magnetization free layer for sensing an external magnetic field of a magnetic recording medium or the like. Namely, the spin accumulation magnetic sensor can detect a magnetic state as an output voltage by making use of only the spin current. Therefore, there is no risk of observation of the unnecessary signal, which was observed in the magnetoresistive element, in the spin accumulation magnetic sensor.

Patent Document 1: Japanese Patent Application Laid-open No. 2007-299467

Patent Document 2: Japanese Patent No. 4029772

SUMMARY OF THE INVENTION

Incidentally, from the viewpoint of producing the spin accumulation magnetic sensor with high output, conceivable methods include a method of making the distance between the magnetization free layer and the magnetization fixed layer sufficiently shorter than the spin diffusion length, a method of realizing electrode arrangement taking account of two-dimensional flow of spin current, and so on. Another conceivable method is a method of providing an insulating layer between the magnetization free layer and magnetization fixed layer and the channel layer, in order to inject more spin-polarized electrons from the magnetization fixed layer into the channel layer, but these were not satisfactory.

It is also conceivable to increase the output by increase in the electric current, but simple increase in the current value will result in increase in resistance in opposed surfaces between the magnetization fixed layer and the channel layer, with increase in current density. As a result, spins become less likely to be injected from the magnetization fixed layer into the channel layer, resulting in a failure in obtaining a sufficient potential output.

The present invention has been accomplished in view of the above circumstances and an object of the present invention is to provide a magnetic sensor permitting an increase in potential output.

In order to solve the above problem, a magnetic sensor according to the present invention is a magnetic sensor comprising: a channel layer; a magnetization free layer provided on a first portion of the channel layer and configured to detect an external magnetic field; and a magnetization fixed layer provided on a second portion different from the first portion of the channel layer, wherein a cross-sectional area of the magnetization fixed layer in a surface opposed to the channel layer is larger than a cross-sectional area of the magnetization free layer in a surface opposed to the channel layer.

In the magnetic sensor of the present invention, as described above, the area of the opposed surfaces between the magnetization free layer and the channel layer is relatively smaller than the area of the opposed surfaces between the magnetization fixed layer and the channel layer. For this reason, the current density per unit area in the opposed surfaces of the electric current flowing from the magnetization fixed layer into the channel layer can be decreased by increasing the area of the opposed surfaces between the magnetization fixed layer and the channel layer. Therefore, it becomes feasible to reduce the resistance in the opposed surfaces and thereby to inject spins from the magnetization fixed layer into the channel layer more efficiently than in the conventional magnetic sensors. On the other hand, the density per unit area in the opposed surfaces of spins flowing from the channel layer into the magnetization free layer can be increased by decreasing the area of the opposed surfaces between the magnetization free layer and the channel layer, whereby a voltage generated from the magnetization free layer can be increased. For this reason, the magnetic sensor of the present invention is able to provide a higher potential output than the conventional magnetic sensors.

In the magnetic sensor of the present invention, preferably, when viewed from a thickness direction of the channel layer, a width of the magnetization fixed layer in a direction perpendicular to a straight line connecting a geometrical centroid of the magnetization free layer and a geometrical centroid of the magnetization fixed layer is larger than a width of the magnetization free layer in the direction perpendicular to the straight line. When the shapes of the magnetization fixed layer and the magnetization free layer are defined as described above, the overall movement distance of spins diffused from the magnetization fixed layer through the channel layer into the magnetization free layer can be made relatively shorter than in the case where the width of the magnetization fixed layer in the direction perpendicular to the straight line is smaller than the width of the magnetization free layer in the same direction, whereby the potential output in the magnetic sensor can be efficiently increased. The "geometrical centroid" herein refers to a point in a certain graphic around which the first-order moment is 0.

In the magnetic sensor of the present invention, preferably, when viewed from the thickness direction of the channel layer, a length of the magnetization fixed layer in a direction along the straight line is smaller than the width of the magnetization fixed layer. When the magnetization fixed layer has this shape, the overall movement distance of spins diffused from the magnetization fixed layer through the channel layer into the magnetization free layer can be made relatively shorter than in the case where the length of the magnetization fixed layer in the direction along the straight line is larger than the width of the magnetization fixed layer. For this reason, it becomes feasible to efficiently increase the potential output in the magnetic sensor.

In the magnetic sensor of the present invention, preferably, when viewed from the thickness direction of the channel layer, the magnetization fixed layer has an arc shape forming a part of a circle centered on the geometrical centroid of the magnetization free layer. When the magnetization fixed layer has the arc shape as described above, the distance becomes approximately equal between each part in the magnetization fixed layer and the magnetization free layer, whereby the spin injection from the magnetization fixed layer into the magnetization free layer can be efficiently carried out, which permits the magnetic sensor to provide a higher potential output than the conventional magnetic sensors.

Furthermore, preferably, the magnetization fixed layer has the arc shape as described above and is line-symmetric with respect to the straight line. This permits a plurality of spins in the magnetization fixed layer to be diffused into the magnetization free layer, while an orientation of magnetization in the direction perpendicular to the straight line is defined as a sum of spin vectors of the respective spins. By devising the shape of the magnetization fixed layer in this manner, it becomes feasible to efficiently increase the potential output in the magnetic sensor.

In the magnetic sensor of the present invention, preferably, when viewed from the thickness direction of the channel layer, a width of the channel layer in the direction perpendicular to the aforementioned straight line decreases from the magnetization fixed layer to the magnetization free layer. This permits spins injected from the magnetization fixed layer into the channel layer to be concentrated and diffused to the magnetization free layer. As a consequence, it becomes feasible to more efficiently increase the potential output in the magnetic sensor.

The magnetic sensor of the present invention preferably further comprises a permanent magnet for applying a bias magnetic field to the magnetization free layer. Since this configuration controls the magnetic anisotropy of the magnetization free layer, the magnetic domain structure of the magnetization free layer is unified and stabilized, so as to enable suppression of Barkhausen noise due to domain wall displacement.

Preferably, a direction of magnetization of the magnetization fixed layer is fixed by at least one of an antiferromagnetic layer, shape anisotropy, and an external magnetic field applied during film formation. When the orientation of magnetization of the magnetization fixed layer is fixed by provision of the antiferromagnetic layer on the magnetization fixed layer or by the shape anisotropy of the magnetization fixed layer, it becomes easy to make the orientation of magnetization of the magnetization fixed layer insensitive to the external magnetic field.

Preferably, a coercive force of the magnetization fixed layer is larger than a coercive force of the magnetization free layer. This makes it feasible to suitably realize the functions of the magnetization fixed layer and the magnetization free layer in the magnetic sensor.

Preferably, the magnetization free layer is arranged on a side where a magnetic flux as a detection object of the channel layer enters, and the magnetization fixed layer is arranged on the opposite side to the side where the magnetic flux as the detection object of the channel layer enters. When the magnetization free layer is located in proximity to the magnetic recording medium, it becomes feasible to detect magnetic information in the magnetic recording medium and thereby reproduce the magnetic information.

Preferably, a material of the magnetization free layer is a metal selected from the group consisting of Cr, Mn, Co, Fe, and Ni, an alloy containing at least one element in the group, or an alloy containing at least one element selected from the group and at least one element selected from the group consisting of B, C, and N. Since these materials are soft magnetic materials, it is feasible to suitably realize the function of the magnetization free layer in the magnetic sensor.

Preferably, a material of the magnetization fixed layer is a metal selected from the group consisting of Cr, Mn, Co, Fe, and Ni, an alloy containing at least one element in the group, or an alloy containing at least one element selected from the group and at least one element selected from the group consisting of B, C, and N. Since these materials are ferromagnetic materials with large spin polarizability, it is feasible to suitably realize the function of the magnetization fixed layer in the magnetic sensor.

Preferably, a material of the channel layer is a material containing at least one element selected from the group consisting of B, C, Mg, Al, Cu, and Zn. Since these materials have a long spin diffusion length and relatively small electroconductivity, it becomes feasible to suitably realize the function of the channel layer as a spin accumulation layer. The material of the channel layer is also preferably a semiconductor compound containing any one of Si, ZnO, and GaAs. Since these semiconductor compounds have a longer spin diffusion length, they are more suitable for letting the channel layer function as a spin accumulation layer and the potential output can be made higher than with the channel layers using the aforementioned metals or the aforementioned alloys.

The present invention successively provides the magnetic sensor permitting the increase in potential output.

BRIEF DESCRIPTION OF THE DRAWINGS

FIG. 1 is a schematic diagram showing a thin-film magnetic recording/reproducing head 100A with a magnetic sensor 100a.

DESCRIPTION OF THE PREFERRED EMBODIMENTS

Embodiments of the present invention will be described below in detail with reference to the accompanying drawings. In the description of the drawings the same elements will be denoted by the same reference symbols, without redundant description.

First Embodiment

A thin-film magnetic recording/reproducing head 100A will be described below as an example of a magnetic sensor according to the first embodiment.

Figure 1:
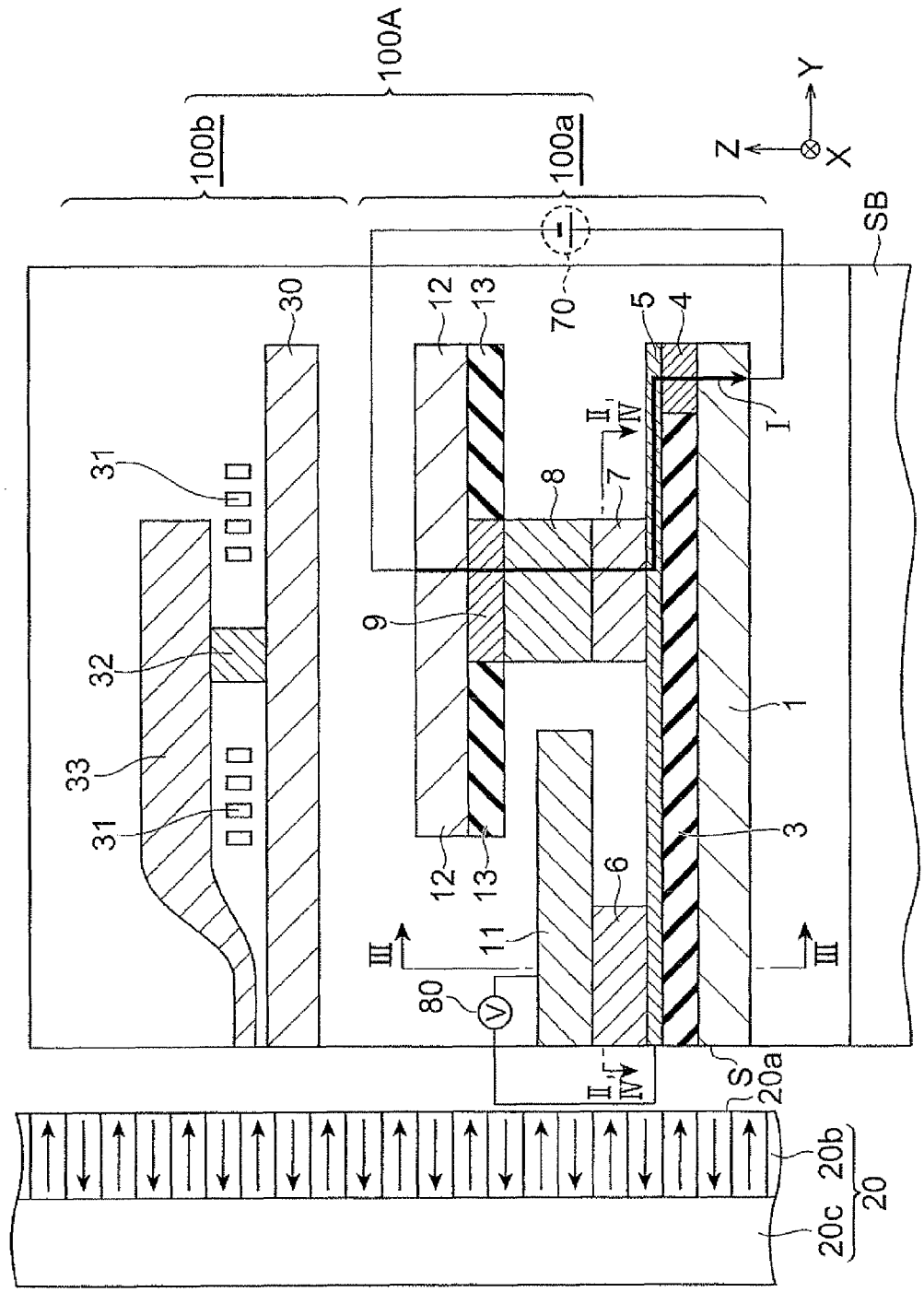
Figure 2:
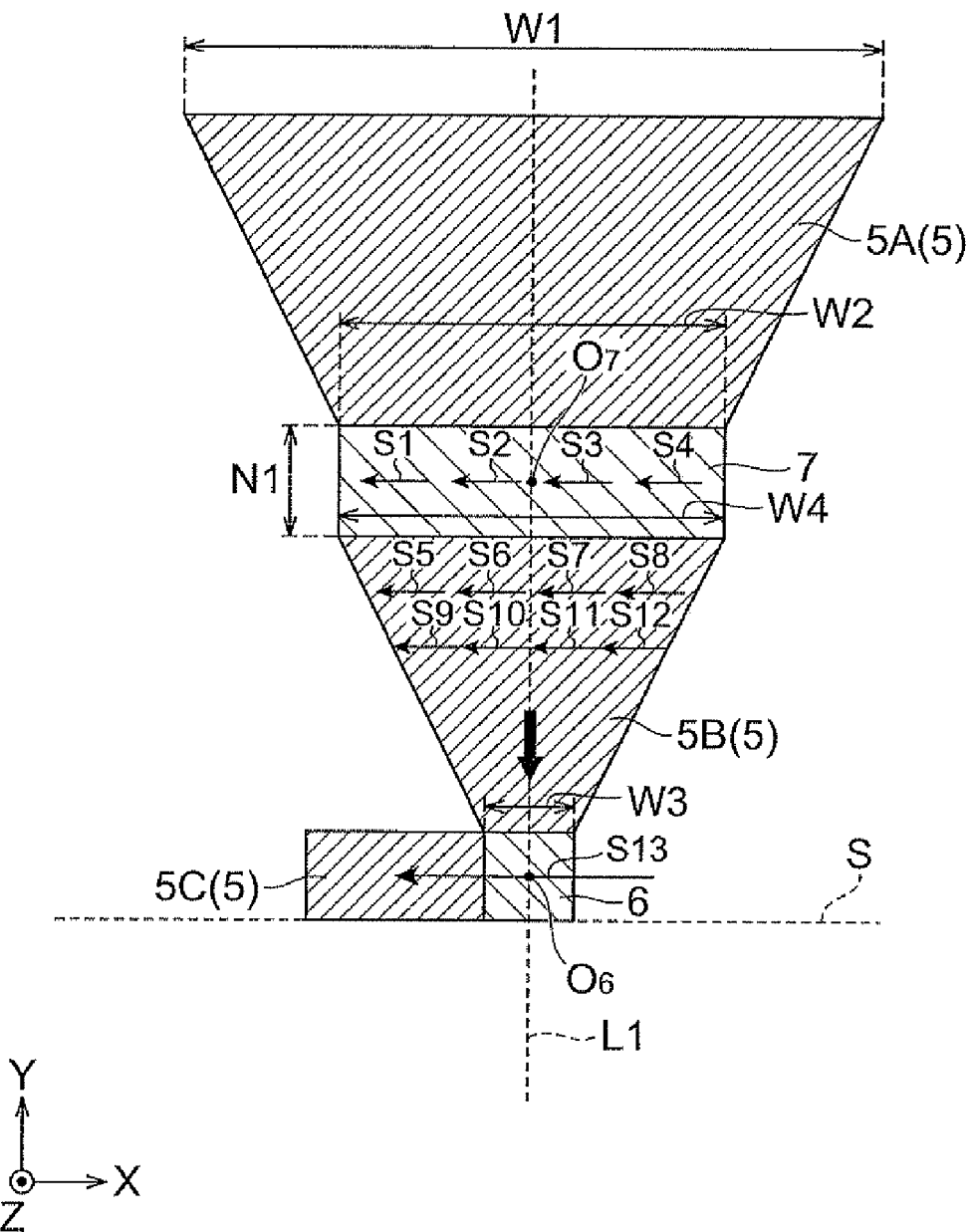
FIG. 2 is a schematic diagram for explaining a sectional configuration along line II-II in FIG. 1.

FIG. 1 is a partial sectional view showing the thin-film magnetic recording/reproducing head 100A. FIG. 2 is a sectional view along line II-II in FIG. 1. FIG. 2 shows a shape of a channel layer without illustration of a third insulating layer 14 and a permanent magnet 15 described later.

The thin-film magnetic recording/reproducing head 100A performs recording and reading operations of magnetic information at a position where its air bearing surface (surface opposed to a medium) S is arranged opposite to a recording surface 20a of a magnetic recording medium 20. The magnetic recording medium 20 consists of a recording layer 20b having the recording surface 20a, and a soft magnetic backing layer 20c laid on the recording layer 20b, and moves relative to the thin-film magnetic recording/reproducing head 100A in a direction indicated by the Z-direction in the drawing.

The thin-film magnetic recording/reproducing head 100A has a magnetic sensor 100a for reading recoded data from the magnetic recording medium 20 and a magnetic recording section 100b for recording data into the magnetic recording medium 20. The magnetic sensor 100a and the magnetic recording section 100b are provided on a substrate SB and are covered by a nonmagnetic insulating layer of alumina or the like. As shown in FIG. 1, the magnetic recording section 100b is disposed on the magnetic sensor 100a. In the magnetic recording section 100b, a contact portion 32 and a main pole 33 are disposed on a return yoke 30 and these form a magnetic flux path. A thin-film coil 31 is provided so as to surround the contact portion 32 and when a recording current is allowed to flow in the thin-film coil 31, a magnetic flux is released from a tip of the main pole 33, whereby information can be recorded in the recording layer 20b of the magnetic recording medium 20 such as a hard disk.

The magnetic sensor 100a is mainly provided with a channel layer 5 to accumulate electron spins, a magnetization free layer 6 disposed on a first portion of the channel layer 5, and a magnetization fixed layer 7 disposed on a second portion different from the first portion of the channel layer 5.

Furthermore, as shown in FIG. 1, the magnetic sensor 100a is further provided with a lower magnetic shield layer 1 and an upper first magnetic shield layer 11 and upper second magnetic shield layer 12 which are opposed to each other with the channel layer 5 in between, a first insulating, layer 3 and a first electrode 4 provided between the lower magnetic shield layer 1 and the channel layer 5, an antiferromagnetic layer 8 disposed on the magnetization fixed layer 7, and a second electrode 9 disposed on the antiferromagnetic layer 8.

The magnetization free layer 6 is a layer for detecting an external magnetic field and acutely detecting a change in magnetization direction in the magnetic recording medium 20 or the like. The magnetization free layer 6 is arranged on the side where a magnetic flux as a detection object of the channel layer 5 enters, i.e., on the air bearing surface S side on the upper surface of the channel layer 5. When the magnetization free layer 6 is located in proximity to the magnetic recording medium 20, magnetic information can be suitably read from the medium 20. A material applicable to the magnetization free layer 6 is a ferromagnetic material, particularly, a soft magnetic material; for example, the material can be a metal selected from the group consisting of Cr, Mn, Co, Fe, and Ni, or an alloy containing at least one of the metals in the foregoing group, or an alloy containing one or more metals selected from the group and at least one of B, C, and N. Specifically, the material can be CoFeB or NiFe.

The magnetization fixed layer 7 is a layer for injecting electrons with a predetermined spin into the channel layer 5, and the magnetization fixed layer 7 is arranged on the opposite side to the side where the magnetic flux as a detection object of the channel layer 5 enters, i.e., on the side apart from the air bearing surface S on the upper surface of the channel layer 5.

As shown in FIG. 2, a cross-sectional area of the magnetization fixed layer 7 in the surface opposed to the channel layer 5 is larger than a cross-sectional area of the magnetization free layer 6 in the surface opposed to the channel layer 5. Namely, the cross-sectional area of the magnetization fixed layer 7 in the surface parallel to the XY plane is larger than the cross-sectional area of the magnetization free layer 6 in the surface parallel to the XY plane.

When viewed from the thickness direction (Z-axis direction) of the channel layer 5, a width W4 of the magnetization fixed layer 7 in a direction (X-direction) perpendicular to a straight line L1 connecting a geometrical centroid $O_6$ of the magnetization free layer 6 and a geometrical centroid $O_7$ of the magnetization fixed layer 7 is larger than a width W3 of the magnetization free layer 6 in the direction perpendicular to the straight line L1. For example, when the magnetization free layer 6 and the magnetization fixed layer 7 are rectangular as shown in FIG. 2, the geometrical centroids $O_6$, $O_7$ are intersections where orthogonal lines of the rectangle intersect.

When viewed from the thickness direction (Z-axis direction) of the channel layer 5, a length N1 of the magnetization fixed layer 7 in the direction (Y-axis direction) along the straight line L1 is smaller than the width W4 of the magnetization fixed layer 7.

The width W4 of the magnetization fixed layer 7 herein refers to a width of a portion demonstrating a maximum value, among those of the magnetization fixed layer 7 in the direction perpendicular to the straight line L1. Likewise, the width W3 of the magnetization free layer 6 refers to a width of a portion demonstrating a maximum value, among those of the magnetization free layer 6 in the direction perpendicular to the straight line L1.

As shown in FIG. 2, when viewed from the thickness direction (Z-axis direction) of the channel layer 5, the shape of the magnetization fixed layer 7 is line-symmetric with respect to the straight line L1.

A material of the magnetization fixed layer 7 can be a ferromagnetic metal material with large spin polarizability; for example, the material can be a metal selected from the group consisting of Cr, Mn, Co, Fe, and Ni, or an alloy containing at least one of the elements in the group, or an alloy containing at least one element selected from the group and at least one element selected from the group consisting of B, C, and N. Specifically, the material can be CoFe or CoFeB.

The coercive force of the magnetization fixed layer 7 is larger than a coercive force of the magnetization free layer 6. The magnetization of the magnetization fixed layer 7 is preferably fixed by at least one magnetization fixing method out of a magnetization fixing method using the antiferromagnetic layer 8 as described below, and a magnetization fixing method by shape anisotropy of the magnetization fixed layer 7. This makes the orientation of magnetization of the magnetization fixed layer 7 insensitive to an external magnetic field.

When the magnetization fixing method using the antiferromagnetic layer 8 is adopted as the magnetization fixing method of the magnetization fixed layer 7, the antiferromagnetic layer 8 is disposed on the magnetization fixed layer 7 as shown in FIG. 1. The antiferromagnetic layer 8 is exchange-coupled with the magnetization fixed layer 7, whereby the magnetization direction of the magnetization fixed layer 7 can be fixed (or provided with unidirectional anisotropy. In this case, the magnetization fixed layer 7 is obtained with higher coercive force in one direction than in the case without provision of the antiferromagnetic layer 8. Therefore, a material used for the antiferromagnetic layer 8 is selected according to the material used for the magnetization fixed layer 7. For example, the material of the antiferromagnetic layer 8 can be an alloy with antiferromagnetism using Mn, specifically, an alloy containing Mn and at least one element selected from Pt, Ir, and Fe. Specifically, the material can be IrMn or PtMn, for example.

On the other hand, when the adopted method is the method of fixing the magnetization of the magnetization fixed layer 7 by providing the magnetization fixed layer 7 with shape anisotropy, the antiferromagnetic layer 8 can be omitted. It is needless to mention that the magnetization may be fixed by both of the antiferromagnetic layer 8 and the shape anisotropy.

The channel layer 5 is a layer in which spins accumulate by spin injection. As shown in FIG. 1, the channel layer 5 is disposed on a plane (XY plane) made by the first insulating layer 3 and the first electrode 4.

The channel layer 5 includes channel forming layers 5A, 5B, and 5C. As shown in FIG. 2, the channel forming layers 5A, 5B, 5C constituting part of the channel layer are provided on the XY plane. Although not shown, other portions of the channel layer 5 are provided respectively below the magnetization free layer 6 and below the magnetization fixed layer 7.

The channel forming layer 5A is provided on the Y-axis direction side of the magnetization fixed layer 7. The channel forming layer 5A functions as a region in which a detection current flows. When viewed from the thickness direction (Z-axis direction) of the channel forming layer 5A, the width of the channel forming layer 5A in the direction perpendicular to the straight line L1 increases with distance in the +Y-direction from the magnetization fixed layer 7. Namely, as shown in FIG. 2, the width W2 of the channel forming layer 5A on the magnetization fixed layer 7 side is smaller than the width W1 of the channel forming layer 5A on the opposite side to the magnetization fixed layer 7. The channel forming layer 5C is provided on the −X-direction side of the magnetization free layer 6.

The channel forming layer 5B is provided in a region between the magnetization free layer 6 and the magnetization fixed layer 7. When viewed from the thickness direction (Z-axis direction) of the channel layer 5, the width of the channel forming layer 5B (part of the channel layer 5) in the direction (X-axis direction) perpendicular to the straight line L1 decreases from the magnetization fixed layer 7 to the magnetization free layer 6. As shown in FIG. 2, the width W4 of the channel forming layer 5B in the X-axis direction on the magnetization fixed layer 7 side is larger than the width W3 of the channel forming layer 5B in the X-axis direction on the magnetization free layer 6 side.

A material of the channel layer 5 can be a non-ferromagnetic electroconductive material and a preferably selected material is one with a long spin diffusion length and relatively small electroconductivity. For example, the material of the channel layer 5 can be a material containing at least one element selected from the group consisting of B, C, Mg, Al, Cu, and Zn. Particularly preferred materials are Cu and $MgB_2$. The material of the channel layer 5 may also be a semiconductor compound containing any one of Si, ZnO, and GaAs. Since these semiconductor compounds have a longer spin diffusion length and relatively small electroconductivity, the channel layer 5 using these semiconductor compounds is more suitable for a spin accumulation layer and can provide higher output than the channel layer 5 using the aforementioned metals or alloys.

As shown in FIG. 1, the lower magnetic shield layer 1 is a layer for shielding each of the magnetization free layer 6 and the magnetization fixed layer 7 from magnetism to enter them from the outside, particularly, from the bottom of the magnetic sensor 100a, and is formed below the first insulating layer 3 and the first electrode 4. On the other hand, the upper first magnetic shield layer 11 is formed on the magnetization free layer 6. The upper second magnetic shield layer 12 is formed on a layer structure consisting of the magnetization fixed layer 7, antiferromagnetic layer 8, and second electrode 9. The upper first magnetic shield layer 11 and upper second magnetic shield layer 12 shield each of the magnetization free layer 6 and the magnetization fixed layer 7 from magnetism to enter them from the outside, particularly, from the top of the magnetic sensor 100a. Since the upper first magnetic shield layer 11 and the upper second magnetic shield layer 12 are provided independently of each other, the upper first magnetic shield layer 11 can be used as an electrode for the magnetization free layer 6 and the upper second magnetic shield layer 12 as an electrode for the magnetization fixed layer 7. A material for the lower magnetic shield layer 1, the upper first magnetic shield layer 11, and the upper second magnetic shield layer 12 can be a soft magnetic material, e.g., an alloy containing Ni and Fe, sendust, an alloy containing Fe and Co, an alloy containing Fe, Co, and Ni, or the like.

The first insulating layer 3 is a layer for preventing electron spins accumulated in the channel layer 5, from flowing toward the lower magnetic shield layer 1. The first insulating layer 3 is provided between the channel layer 5 and the lower magnetic shield layer 1. From the viewpoint of efficiently carrying out spin accumulation, the first insulating layer 3 is preferably provided across the region from the magnetization fixed layer 7 side to the magnetization free layer 6 side on the lower surface of the channel layer 5. Furthermore, from the viewpoint of efficiently diffusing spins from the magnetization fixed layer 7 to the magnetization free layer 6 side in the channel layer 5, the first insulating layer 3 is preferably provided so as to overlap in part with the magnetization free layer 6 through the channel layer 5. The first insulating layer 3 can be, for example, $SiO_2$.

The first electrode 4 is an electrode for letting the detection current flow to the magnetization fixed layer 7. The first electrode 4 is provided next to the first insulating layer 3 on the opposite side to the air bearing surface S, on the lower surface of the channel layer 5. In FIG. 1, the channel layer 5 is electrically connected to the lower magnetic shield layer 1 through the first electrode 4. Therefore, the lower magnetic shield layer 1 provided below the first electrode 4 can be used as an electrode for letting the detection current I flow to the magnetization fixed layer 7. The first electrode 4 can be, for example, a metal material such as Cu or Ta.

The second electrode 9 is a layer for electrically connecting the upper second magnetic shield layer 12 and the antiferromagnetic layer 8, in order to allow the electric current to flow in the magnetization fixed layer 7 with the upper second magnetic shield layer 12 as an electrode. The second electrode 9 also has an effect to suppress diffusion of atoms or the like between the upper second magnetic shield layer 12 and the antiferromagnetic layer 8 or the magnetization fixed layer 7. A material of the second electrode 9 can be, for example, a metal material such as Cu or Ta.

The second insulating layer 13 is formed at both ends of the second electrode 9. The second insulating layer 13 can be, for example, $SiO_2$.

A barrier layer may be provided between the channel layer 5 and the magnetization free layer 6 and between the channel layer 5 and the magnetization fixed layer 7. For example, the barrier layer may be provided across the region from the magnetization fixed layer 7 side to the magnetization free layer 6 side on the channel layer 5. The barrier layer is a tunnel insulating layer and a material applicable to the barrier layer is an insulator such as aluminum oxide or magnesium oxide, or a semiconductor such as zinc oxide.

Figure 3:
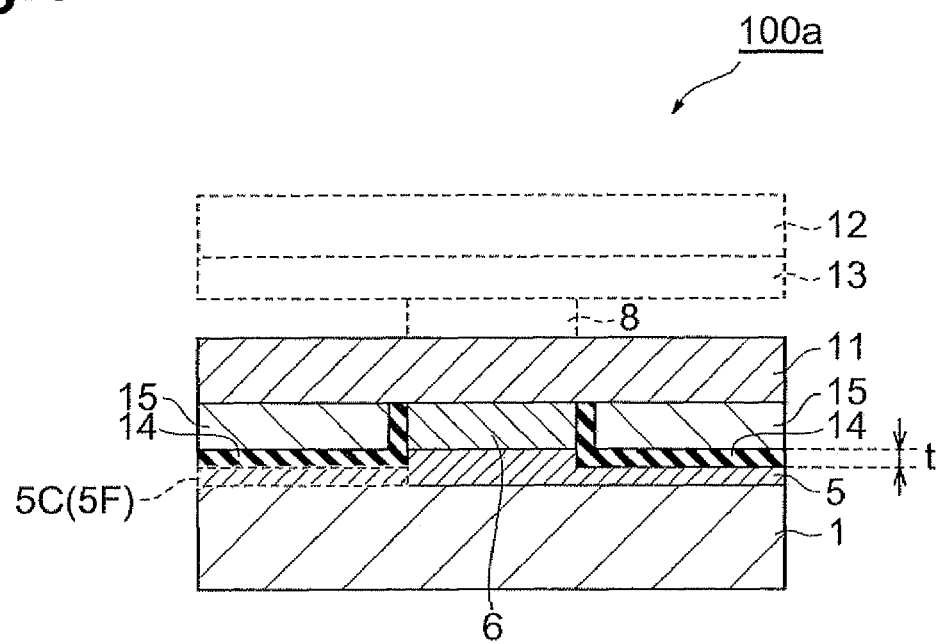
FIG. 3 is a schematic diagram for explaining a sectional configuration along line in FIG. 1.

The below will describe the sectional shape parallel to the X-direction, of the magnetic sensor 100a shown in FIG. 1, using FIG. 3. FIG. 3 is a schematic view for explaining a sectional configuration along line III-III in FIG. 1.

As shown in FIG. 3, the portion of the channel layer 5 located immediately below the magnetization free layer 6 is preferably thicker by a thickness t of the third insulating layer 14 described below, than the portion of the channel layer 5 other than the portion immediately below the magnetization free layer 6. This is for making the thickness of the magnetization free layer 6 equal to the thickness of the permanent magnet 15 described below, which permits more uniform stabilization of the magnetic domain structure of the magnetization free layer 6.

The third insulating layer 14 is provided between the channel layer 5 and the magnetization free layer 6 and permanent magnet 15, and is a layer for insulating the channel layer 5 and the magnetization free layer 6 from the permanent magnet 15. The third insulating layer 14 can be $SiO_2$ or the like.

The permanent magnet 15 is arranged on both sides of the magnetization free layer 6 with the third insulating layer 14 in between. When a bias magnetic field is applied to the magnetization free layer 6, using a leakage magnetic flux from the permanent magnet 15, the magnetic domain structure of the magnetization free layer 6 can be stabilized (or uniaxially oriented). This enables suppression of Barkhausen noise due to domain wall displacement.

The below will describe an example of a method for producing the magnetic sensor 100a according to the first embodiment. First, the lower magnetic shield layer 1 and the first insulating layer 3 are continuously deposited by sputtering in this order on the substrate SB provided with a thermal silicon oxide film. Then part of the first insulating layer 3 is scraped off by milling and the first electrode 4 is deposited on the scraped part.

Next, the surfaces of the first insulating layer 3 and the first electrode 4 are polished so as to flatten by chemical mechanical polishing (CMP). Thereafter, the channel layer 5, the magnetization free layer 6 and magnetization fixed layer 7, the antiferromagnetic layer 8, and the second insulating layer 13 are deposited in this order on the flattened surface. Then the resultant is scraped by milling to the magnetization free layer 6 and the magnetization fixed layer 7 so as to obtain the shapes of the magnetization free layer 6 and the magnetization fixed layer 7 as shown in FIG. 2. Furthermore, the channel layer is scraped by milling so as to obtain the shape as shown in FIG. 2.

Thereafter, an excess layer on the magnetization free layer 6 is scraped off to form the upper first magnetic shield layer 11. On the other hand, part of the second insulating layer 13 on the antiferromagnetic layer 8 is scraped off, the second electrode 9 is deposited thereon, and thereafter the upper second magnetic shield layer 12 is formed thereon. The magnetic sensor is completed as described above.

The below will describe the operation of the magnetic sensor 100a of the first embodiment shown in FIG. 1. For allowing the detection current to flow to the magnetization fixed layer 7, the lower magnetic shield layer 1 and the upper second magnetic shield layer 12 are electrically connected to a current source 70. The channel layer 5 and the upper first magnetic shield layer 11 are electrically connected to a voltage measuring device 80. If the upper first magnetic shield layer 11 is located away from the magnetization free layer 6 and insulated from the magnetization free layer 6, the channel layer 5 and the magnetization free layer 6 may be electrically connected to the voltage measuring device 80.

First, the detection current I is allowed to flow to the magnetization fixed layer 7 of the magnetic sensor 100a. For example, as shown in FIG. 1, the detection current I from the current source 70 is made to flow in the order of the upper second magnetic shield layer 12, the second electrode 9, the antiferromagnetic layer 8, the magnetization fixed layer 7, the channel layer 5, the first electrode 4, and the lower magnetic shield layer 1.

When the detection current I is made to flow from the magnetization fixed layer 7 of the ferromagnet to the channel layer 5 as described above, electrons with the spin corresponding to the orientation of magnetization of the magnetization fixed layer 7 flow into the channel layer 5 through the interface between the magnetization fixed layer 7 and the channel layer 5 (spin injection). The spins further diffuse from the magnetization fixed layer 7 side to the magnetization free layer 6 side in the channel layer 5.

Mutually different potentials appear at the interface between the magnetization free layer 6 and the channel layer 5, according to a relative angle between the orientation of magnetization of the magnetization free layer 6, which varies depending upon the external magnetic field, and the orientation of magnetization of the magnetization fixed layer 7. In the present embodiment, the voltage measuring device detects a voltage appearing between the channel layer 5 and the upper first magnetic shield layer 11. In this manner, the magnetic sensor 100a can be applied as an external magnetic field sensor.

The below will describe the effect by the magnetic sensor 100a of the first embodiment. In the magnetic sensor of the first embodiment, the cross-sectional area of the magnetization fixed layer in the surface opposed to the channel layer is larger than the cross-sectional area of the magnetization free layer in the surface opposed to the channel layer. Namely, the area of the opposed surfaces between the magnetization free layer and the channel layer is relatively smaller than the area of the opposed surfaces between the magnetization fixed layer and the channel layer. This configuration can decrease the current density per unit area in the opposed surfaces of the electric current flowing between the magnetization fixed layer and the channel layer by increasing the area of the opposed surfaces between the magnetization fixed layer and the channel layer, whereby the resistance of the opposed surfaces is reduced, so as to enable efficient spin injection into the channel layer when compared with the conventional magnetic sensors. On the other hand, the density per unit area in the opposed surfaces of spins flowing from the channel layer into the magnetization free layer can be increased by decreasing the area of the opposed surfaces between the magnetization free layer and the channel layer, whereby the voltage appearing from the magnetization free layer can be increased. This allows the magnetic sensor of the present invention to provide a higher potential output than the conventional magnetic sensors.

When viewed from the thickness direction of the channel layer, the width of the magnetization fixed layer in the direction perpendicular to the straight line connecting the geometrical centroid of the magnetization free layer and the geometrical centroid of the magnetization fixed layer is larger than the width of the magnetization free layer in the same direction; whereby the overall movement distance of spins diffusing from the magnetization fixed layer through the channel layer to the magnetization free layer can be made relatively shorter than in the case where the width of the magnetization fixed layer in the direction perpendicular to the straight line is smaller than the width of the magnetization free layer in the same direction. This enables efficient increase in the potential output in the magnetic sensor.

When viewed from the thickness direction of the channel layer, the length of the magnetization fixed layer in the direction along the straight line is smaller than the width of the magnetization fixed layer, whereby the overall movement distance of spins diffusing from the magnetization fixed layer through the channel layer to the magnetization free layer can be made relatively shorter than in the case where the length of the magnetization fixed layer in the direction along the straight line is larger than the width of the magnetization fixed layer. This also enables efficient increase in the potential output in the magnetic sensor.

In the magnetic sensor according to the present invention, when viewed from the thickness direction of the channel layer, the width of the channel layer in the direction perpendicular to the aforementioned straight line decreases from the magnetization fixed layer to the magnetization free layer, whereby spins injected from the magnetization fixed layer into the channel layer can be concentrated and diffused toward the magnetization free layer. As a consequence, it becomes feasible to implement more efficient increase in the potential output in the magnetic sensor.

A supplementary explanation of the above effect will be given below. As shown in FIG. 2, when spins $S_1$, $S_2$ existing in the −X-direction with respect to the straight line L1 in the magnetization fixed layer 7 are injected into the channel forming layer 5B, they are diffused in the +X-direction (to the positions of spins $S_5$, $S_6$ shown in FIG. 2) from the positions in the magnetization fixed layer 7. On the contrary, when spins $S_3$, $S_4$ existing in the +X-direction with respect to the straight line L1 in the magnetization fixed layer 7 are injected into the channel forming layer 5B, they are diffused in the −X-direction (to the positions of spins $S_7$, $S_8$ shown in FIG. 2) from the positions in the magnetization fixed layer 7.

The diffused spins $S_5$, $S_6$ further diffuse to the +X-direction (to the positions of spins $S_9$, $S_{10}$ shown in FIG. 2) in the channel forming layer 5B. On the contrary, the diffused spins $S_7$, $S_8$ further diffuse to the −X-direction (to the positions of spins $S_{11}$, $S_{12}$ shown in FIG. 2) in the channel forming layer 5B.

The spins can be injected into the magnetization free layer 6, as a sum $S_{13}$ of spin vectors of these spins $S_9$, $S_{10}$, $S_{11}$, and $S_{12}$ having diffused to the region of the channel forming layer 5B on the magnetization free layer 6 side. In this manner, the spins injected from the magnetization fixed layer 7 into the channel layer 5 (channel forming layer 5B) can be suitably concentrated and diffused to the magnetization free layer 6 side, which achieves more efficient increase in the potential output in the magnetic sensor.

Second Embodiment

Figure 4:
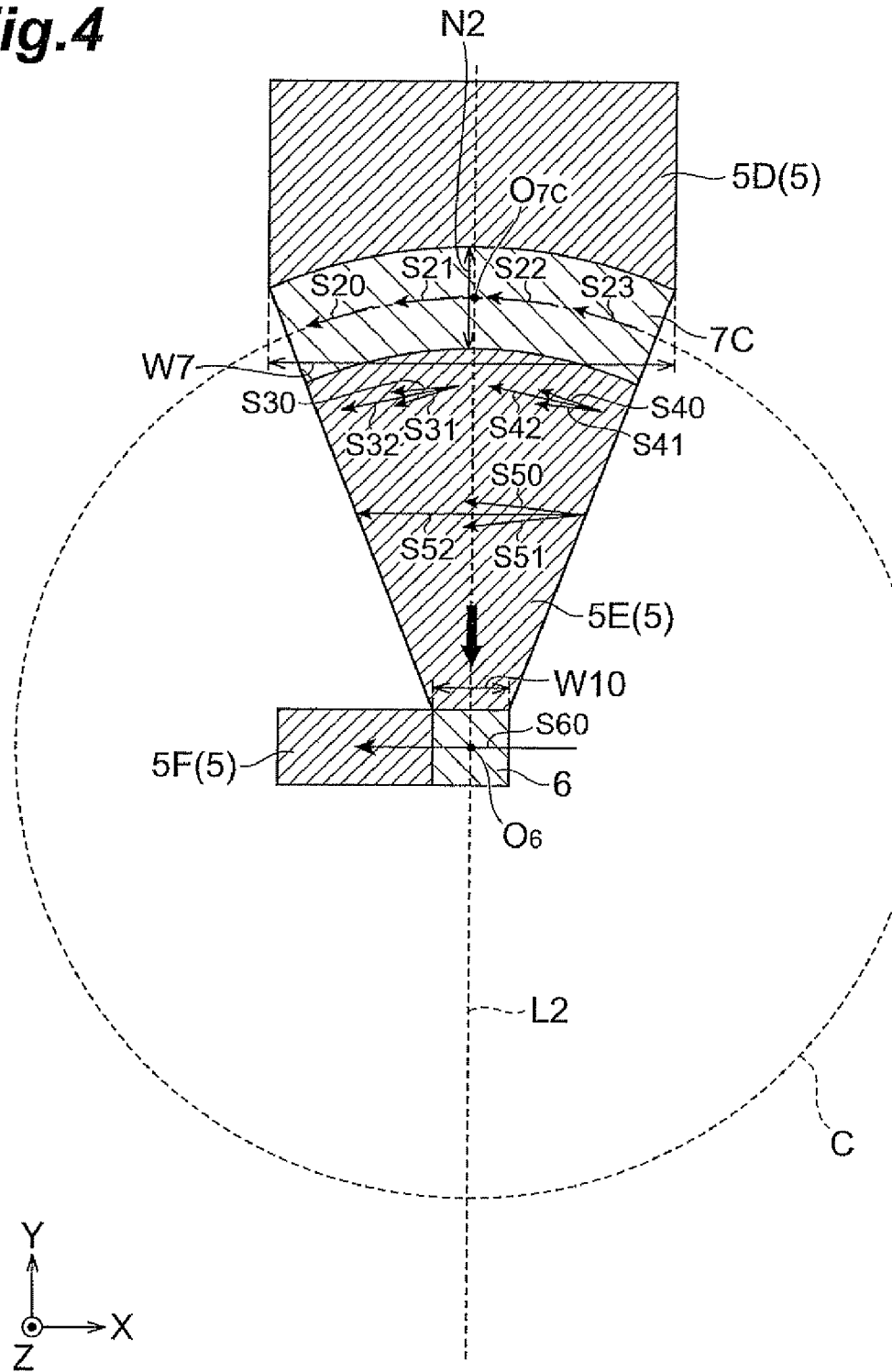
FIG. 4 is a schematic diagram for explaining a sectional configuration along line IV-IV in FIG. 1.

The magnetic sensor according to the second embodiment will be described below. FIG. 4 is a sectional view along line IV-IV in FIG. 1. In FIG. 4, the shape of the channel layer is depicted without illustration of the aforementioned third insulating layer 14 and permanent magnet 15.

The magnetic sensor shown in FIG. 4 is different in the shapes of the magnetization fixed layer and the channel layer from the magnetic sensor of the first embodiment, and only these will be described below.

In the magnetic sensor of the second embodiment, as shown in FIG. 4, when viewed from the thickness direction (Z-axis direction) of the channel layer, the magnetization fixed layer 7C has an arc shape which forms a part of a circle centered on the geometrical centroid $O_6$ of the magnetization free layer 6. Furthermore, when viewed from the thickness direction of the channel layer, the magnetization fixed layer 7C is line-symmetric with respect to a straight line L2 connecting the geometrical centroid $O_6$ of the magnetization free layer 6 and the geometrical centroid $O_{7C}$ of the magnetization fixed layer 7C.

A cross-sectional area of the magnetization fixed layer 7C in the surface opposed to the channel layer is larger than the cross-sectional area of the magnetization free layer 6 in the surface opposed to the channel layer. When viewed from the thickness direction (Z-axis direction) of the channel layer, a width W7 of the magnetization fixed layer 7C in the direction (X-axis direction) perpendicular to the straight line L2 connecting the geometrical centroid $O_6$ of the magnetization free layer 6 and the geometrical centroid $O_{7C}$ of the magnetization fixed layer 7C is larger than the width W10 of the magnetization free layer 6 in the same direction. When viewed from the thickness direction (Z-axis direction) of the channel layer, a length N2 of the magnetization fixed layer 7C in the direction (Y-axis direction) along the aforementioned straight line L2 is smaller than the width W7 of the magnetization fixed layer 7C.

The width W7 of the magnetization fixed layer 7C herein refers to a width of a portion demonstrating a maximum value, among those of the magnetization fixed layer 7C in the direction perpendicular to the straight line L2. The length N2 of the magnetization fixed layer 7C refers to a length of a portion demonstrating a maximum value, among those of the magnetization fixed layer 7C in the direction along the straight line L2. Similarly, the width W10 of the magnetization free layer 6 refers to a width of a portion demonstrating a maximum value, among those of the magnetization free layer 6 in the direction perpendicular to the straight line L2.

The channel layer includes channel forming layers 5D, 5E, and 5F. As shown in FIG. 4, the channel forming layers 5D, 5E, 5F forming part of the channel layer are provided on the XY plane. Although not shown, the other portions of the channel layer are provided respectively below the magnetization free layer 6 and below the magnetization fixed layer 7C.

The channel forming layer 5D is provided on the +Y-direction side of the magnetization fixed layer 7C. The channel forming layer 5D functions as a region where the detection current flows. The channel forming layer 5F is provided on the −X-direction side of the magnetization free layer 6. When viewed from the thickness direction (Z-axis direction) of the channel layer, the width of the channel forming layer 5E (part of the channel layer 5) in the direction perpendicular to the aforementioned straight line L2 decreases from the magnetization fixed layer 7C to the magnetization free layer 6.

In the magnetic sensor of the second embodiment, the magnetization fixed layer 7C has the arc shape, whereby the distance becomes approximately equal between each part in the magnetization fixed layer 7C and the magnetization free layer 6. This enables efficient spin injection from the magnetization fixed layer 7C into the magnetization free layer 6, whereby a higher potential output can be obtained than in the case of the conventional magnetic sensors.

Furthermore, since the magnetization fixed layer 7C has the arc shape as described above and is line-symmetric with respect to the aforementioned straight line L2, spins can be diffused into the magnetization free layer 6 while the orientation of magnetization in the direction perpendicular to the straight line L2 is defined as a sum of spin vectors of the respective spins in the magnetization fixed layer 7C. When the shape of the magnetization fixed layer 7C is devised in this manner, it becomes feasible to achieve efficient increase in the potential output in the magnetic sensor.

A supplementary explanation of the above effect will be given below. As shown in FIG. 4, when spins $S_{20}$, $S_{21}$ existing in the −X-direction with respect to the straight line L2 in the magnetization fixed layer 7C are injected into the channel forming layer 5E, they diffuse as a sum $S_{32}$ of spin vectors of spin $S_{31}$ corresponding to the spin $S_{20}$ and spin $S_{30}$ corresponding to the spin $S_{21}$. On the other hand, when spins $S_{22}$, $S_{23}$ existing in the +X-direction with respect to the straight line L2 in the magnetization fixed layer 7C are injected into the channel forming layer 5E, they diffuse as a sum $S_{42}$ of spin vectors of spin $S_{41}$ corresponding to the spin $S_{22}$ and spin $S_{40}$ corresponding to the spin $S_{23}$.

Furthermore, in the channel forming layer 5E, the spins diffuse as a sum $S_{52}$ of spin vectors of spin $S_{51}$ corresponding to the spin $S_{32}$ and spin $S_{50}$ corresponding to the spin $S_{42}$. Then this sum $S_{52}$ of spin vectors is diffused to the region of the channel forming layer 5E on the magnetization free layer 6 side and injected into the magnetization free layer 6. In this manner, the spins injected from the magnetization fixed layer 7C into the channel layer (channel forming layer 5E) are suitably concentrated and diffused to the magnetization free layer 6, which enables more efficient increase in the potential output in the magnetic sensor.

The above described each of the embodiments, using the example of application of the magnetic sensor of the present invention to the thin-film magnetic recording/reproducing head, but it is noted that the magnetic sensor of the present invention is also applicable to various uses other than the thin-film magnetic recording/reproducing head, e.g., a magnetic encoder device, a magnetic field measuring device, a magnetism detecting device, etc. used in a compact robot, a digital camera, an ink jet printer, and so on.

What is claimed is:

1. A magnetic sensor comprising:
a channel layer;
a magnetization free layer provided on a first portion of the channel layer and configured to detect an external magnetic field; and
a magnetization fixed layer provided on a second portion different from the first portion of the channel layer,
wherein a cross-sectional area of the magnetization fixed layer in a surface opposed to the channel layer is larger than a cross-sectional area of the magnetization free layer in a surface opposed to the channel layer.

2. The magnetic sensor according to claim 1, wherein, when viewed from a thickness direction of the channel layer, a width of the magnetization fixed layer in a direction perpendicular to a straight line connecting a geometrical centroid of the magnetization free layer and a geometrical centroid of the magnetization fixed layer is larger than a width of the magnetization free layer in the direction perpendicular to the straight line.

3. The magnetic sensor according to claim 2, wherein, when viewed from the thickness direction of the channel layer, a length of the magnetization fixed layer in a direction along the straight line is smaller than the width of the magnetization fixed layer.

4. The magnetic sensor according to claim 2, wherein, when viewed from the thickness direction of the channel layer, the magnetization fixed layer has an arc shape forming a part of a circle centered on the geometrical centroid of the magnetization free layer.

5. The magnetic sensor according to claim 4, wherein, when viewed from the thickness direction of the channel layer, the magnetization fixed layer is line-symmetric with respect to the straight line.

6. The magnetic sensor according to claim 1, wherein, when viewed from a thickness direction of the channel layer, a width of the channel layer in a direction perpendicular to a straight line connecting a geometrical centroid of the magnetization free layer and a geometrical centroid of the magnetization fixed layer decreases from the magnetization fixed layer to the magnetization free layer.

7. The magnetic sensor according to claim 1, further comprising a permanent magnet for applying a bias magnetic field to the magnetization free layer.

8. The magnetic sensor according to claim 1, wherein a direction of magnetization of the magnetization fixed layer is fixed by at least one of an antiferromagnetic layer, shape anisotropy, and an external magnetic field applied during film formation.

9. The magnetic sensor according to claim 1, wherein a coercive force of the magnetization fixed layer is larger than a coercive force of the magnetization free layer.

10. The magnetic sensor according to claim 1, wherein the magnetization free layer is arranged on a side where a magnetic flux as a detection object of the channel layer enters, and
wherein the magnetization fixed layer is arranged on the opposite side to the side where the magnetic flux as the detection object of the channel layer enters.

11. The magnetic sensor according to claim 1, wherein a material of the magnetization free layer is a metal selected from the group consisting of Cr, Mn, Co, Fe, and Ni, an alloy containing at least one element in the group, or an alloy containing at least one element selected from the group and at least one element selected from the group consisting of B, C, and N.

12. The magnetic sensor according to claim 1, wherein a material of the magnetization fixed layer is a metal selected from the group consisting of Cr, Mn, Co, Fe, and Ni, an alloy containing at least one element in the group, or an alloy containing at least one element selected from the group and at least one element selected from the group consisting of B, C, and N.

13. The magnetic sensor according to claim 1, wherein a material of the channel layer is a material containing at least one element selected from the group consisting of B, C, Mg, Al, Cu, and Zn.

14. The magnetic sensor according to claim 1, wherein a material of the channel layer is a semiconductor compound containing any one of Si, ZnO, and GaAs.

* * * * *